United States Patent [19]
Sasaki

[11] Patent Number: 5,480,918
[45] Date of Patent: Jan. 2, 1996

[54] INITIATOR FOR PHOTOPOLYMERIZATION

[75] Inventor: Yusuke Sasaki, Shintone, Japan

[73] Assignee: Autex, Inc., Japan

[21] Appl. No.: 323,519

[22] Filed: Oct. 14, 1994

Related U.S. Application Data

[62] Division of Ser. No. 919,016, Jul. 23, 1992, Pat. No. 5,389,700.

[30] Foreign Application Priority Data

Oct. 30, 1991 [JP] Japan .................................. 3-310048

[51] Int. Cl.$^6$ ........................................... C08F 2/46
[52] U.S. Cl. ............................. 522/64; 522/47; 522/65; 522/66; 522/67
[58] Field of Search .................... 522/47, 64, 65, 522/66, 67

[56] References Cited

U.S. PATENT DOCUMENTS

| | | | |
|---|---|---|---|
| 3,975,289 | 8/1976 | Froix | 252/300 |
| 4,273,668 | 6/1981 | Crivello | 252/182 |
| 4,868,288 | 9/1989 | Meier | 534/15 |
| 5,068,367 | 11/1991 | Vazquez et al. | 552/310 |

FOREIGN PATENT DOCUMENTS

| | | |
|---|---|---|
| 0152377 | 8/1985 | European Pat. Off. . |
| 50-151996 | 8/1975 | Japan . |
| 56-15261 | 2/1981 | Japan . |
| 58-210904 | 12/1983 | Japan . |
| 61-23020 | 10/1986 | Japan . |

OTHER PUBLICATIONS

Crivello, J. V., "Photoinitiated Cationic Polymerization", *Ann. Rev. Mater. Sci.*, 1983.13, pp. 173–190.
Meier, K. et al., "Photoinitiated Cationic Polymerization of Epoxides with Iron–Arene Complexes", *Journal of Radiation Curing*, Oct. 1986, pp. 26–32.
Sato, Masaru et al., "Synthesis and some Properties of Ferrocene Derivatives having a Long Alkyl Chain. Formation of a Regularly . . . ", *J. Chem. Soc., Chem. Commun.*, 1988, pp. 24–25.
Miller, Joel S. et al., "Ferromagnetic Behavior in Linear Charge–Transfer . . . ", *Inorg. Chem.*, 1989, 28, pp. 2930–2939.
Dixon, David A. et al., "Crystal and Molecular Structure of the 2:1 Charge–Transfer . . . ", *J. Phys. Chem.*, 1989, 93, pp. 2284–2291.
Webb, Robert J. et al., "Mixed–Valence Biferrocenes: Pronounced Anion . . . ", *J. Am. Chem. Soc.*, 1990, 112, pp. 5031–5042.
Chi, Kai–Ming et al., "Ferromagnetic Behavior of Linear–Chain Electron–Transfer . . . ", *Organometallics*, 1991, 10, pp. 688–693.
Sokolov, V. I. et al., "Enantiomeric Ferricinium Salts", *Chemical Abstracts*, vol. 114, 1991, Abstract No. 247463c.

*Primary Examiner*—Mark A. Chapman
*Attorney, Agent, or Firm*—Webb Ziesenheim Bruening Logsdon Orkin & Hanson

[57] ABSTRACT

A novel initiator for photopolymerization is provided, which can polymerize cationically polymerizable organic material by only irradiating at wavelength of 200–500 nm without specific sensitizer and/or post-curing even when it is used at comparatively small amount, whereby the obtained cured product has good physical properties and electric properties. The initiator for photopolymerization of cationically polymerizable organic material according to the present invention comprises a composite obtainable from a reaction between (a) charge transfer complex consisting of biscyclopentadienyl iron derivative and quinoid and (b) at least one salt selected from a group consisting of tetrafluoroborates, hexafluorophosphates and hexafluoroantimonates.

7 Claims, No Drawings

INITIATOR FOR PHOTOPOLYMERIZATION

This is a divisional of application Ser. No. 07/919,016 filed on Jul. 23, 1992 now U. S. Pat. No. 5,389,700.

BACKGROUND OF THE INVENTION

1. Field of the Invention

The present invention relates to a novel initiator for photopolymerization of cationically polymerizable organic material. More paticularly, the present invention relates to an initiator for photopolymerization which can be added to cationically polymerizable organic material in a suitable amount and can polymerize the cationically polymerizable material with irradiation of active photo-energy, thereby converting the organic material into high molecular weight state.

2. Disclosure of the Prior Art

Various onium salts such as diazonium salts, iodonium salts, sulfonium salts, etc., and salts of metallocene complexes are known as initiator for photopolymerization of cationically polymerizable material [for example, Annual Reviews Materials Science, 13, 173–190 (1983); Journal of Radiation Curing, 13 (10), 26–32 (1986); Japanese Patent Laid-open No. 151,996/75; Japanese Patent Laid-open No. 15,261/81; and Japanese Patent Laid-open No. 210,904/83].

The working mechanism of these known initiators in photopolymerization are as follows:

In case of using various diazonium salts, iodonium salts and sulfonium salts, a Brønsted acid is generated at first by irradiation of U.V. light in accordance with the Scheme I, II and III.

Scheme I (diazonium salt)

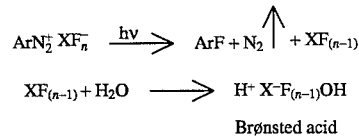

XF$_{(n-1)}$ + H$_2$O ⟶ H$^+$ X$^-$F$_{(n-1)}$OH

Brønsted acid

Scheme II (iodonium salt)

Ar$_2$I$^+$ XF$_n^-$ $\xrightarrow{h\nu}$ [Ar$_2$I$^+$—XF$_n^-$]* ⟶ ArI$\dot{^+}$XF$_n^-$ + Ar·

ArI$\dot{^+}$XF$_n^-$ + RH ⟶ ArI$^+$—HXF$_n^-$ + R· ⟶

ArI + HXF$_n$

Brønsted acid

Scheme III (sulfonium salt)

Ar$_3$S$^+$ XF$_n^-$ $\xrightarrow{h\nu}$ [Ar$_3$S$^+$—XF$_n^-$]* ⟶ Ar$_2$S$\dot{^+}$XF$_n^-$ + Ar·

Ar$_2$S$\dot{^+}$XF$_n^-$ + RH ⟶ Ar$_2$S$^+$—HXF$_n^-$ + R· ⟶

Ar$_2$S + HXF$_n$

Brønsted acid

The generated Brønsted acid can react with the cationically polymerizable organic material and the polymerization proceeds in accordance with Scheme IV, whereby molecular chain of polymer grows.

Scheme IV
(polymerization and growing reaction with Brønsted acid)

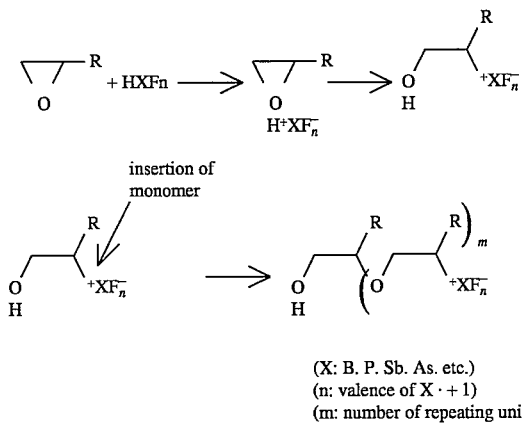

(X: B. P. Sb. As. etc.)
(n: valence of X · + 1)
(m: number of repeating unit)

On the other hand, in case of using a salt of metallocene complex, a Lewis acid is generated with irradiation, and an insertion of monomer occurs at the Lewis acid, whereby molecular chain of polymer grows.

Scheme V (salt of metallocene complex)

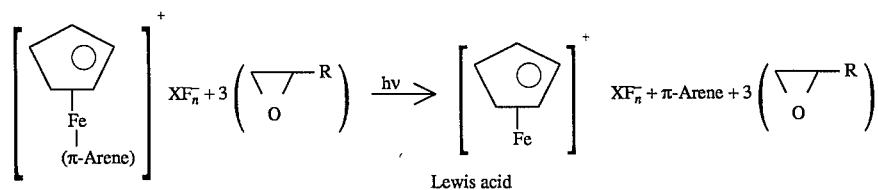

Lewis acid

-continued
Scheme V (salt of metallocene complex)

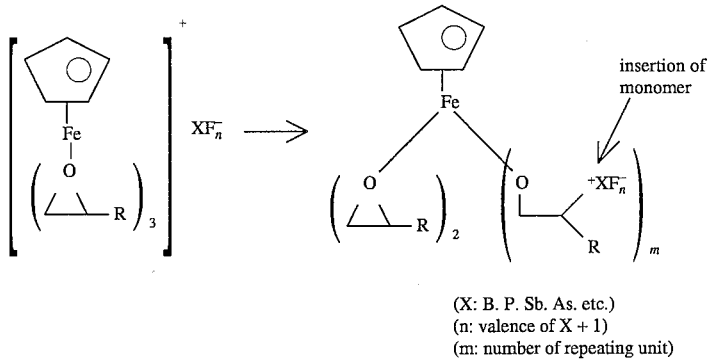

(X: B. P. Sb. As. etc.)
(n: valence of X + 1)
(m: number of repeating unit)

A process of initiation of polymerization with conventional photoinitiators comprises a generation of Brønsted acid or Lewis acid by irradiation of U.V. light. The diffusion of these acids in monomer system and the insertion of monomer into coordinate bond of these acids are rate-determining step of polymerization. The diffusion of these acids or the insertion of monomer is slower than diffusion of radical in photoradical polymerization and accordingly the polymerization with the conven-tional photoinitiators is slower than photoradical polymerization.

The maximum absorption wavelength of the conventional photoinitiators is within ultraviolet shorter wavelength zone of not higher than 300 nm. when a ray having the wavelength exceeding the zone mentioned above is used -(for example, i ray 365 nm; g ray, 436 nm; photolithography with a positive film), the acids which are essential for initiation of polymerization are not generated, or even if the acids are generated, their quantum efficiency is very low.

Therefore, when they are used for polymerization of colored cationical photocuring compositions such as epoxy resin paint, etc.; photocuring compositions usable for sealing, closing adhesion; industrial materials such as photoresist material which is used for preparation of wiring pattern on semiconductor or printed circuit board, they must be used in much amount, or they must be used together with a sensitizer such as aromatic condensed polynucleus compounds (for example, anthracene), thioxanthone, benzoin alkyl ether, alkoxy acetophenone, etc. in order to vest the resulting mixture with photosensitivity in longer wavelength zone or improve reaction rate.

Even if the recipe mentioned above is adopted, insufficient thick film curability is often observed and the cured material which does not have desired physical properties is often obtained. In view of these factors, a composition comprising an initiator which has both of photocuring and thermo-curing has been developed. Such photoinitiators are disclosed in for example, Japanese Patent Laid-open No. 210,904/83 and No. 223,020/86.

However, as the addition amount of photoinitiator increases, the amount of photo-decomposition product increases, and as a result, unpolymerized low molecular-weight compounds may be included in the obtained cured material and remain therein. The use of sensitizer leads also the similar results. When the cured materials including the unpolymerized low molecular weight compounds are used in industrial field, there exist some defects such as rapid deterioration of cured material, corrosion of mother material to be coaded, etc.

An adoption of post-heat curing step is not preferable, because the period of heat curing step is dependent to temperature of mother material to be coated and temperature of atmosphere at which the heat curing is carried out and accordingly the control of period of heat curing is difficult, especially in automatic operation system. In addition, the adoption of post-heat curing step leads an increasment in number of step and time and accordingly injures the merits obtainable from use of photoinitiator and/or sensitizer such as rapid curing, improvement of productivity, etc.

SUMMARY OF THE INVENTION

Since the phenomenon that an electric conductivity is generated by transfer of electron between two materials was found, many charge-transfer complexes comprising various combination of electron acceptor with electron donor have been prepared. The use of such charge-transfer complex as organic photoelectronic material which constitutes electro-conductive parts (such as electrode, etc), semi-conductor parts (such as polymer battery, transistor, diode, etc.) have been studied. However, the development of use based on other properties of charge-transfer complex have not been attempted.

The inventor payed his attention to photochemical reaction which is induced by an excitation of charge-transfer absorption band of the charge-transfer complex, and he has attempted many researches to utilize such photochemical reaction in photoinitiating cationic polymerization. As a result, he found a novel initiator for photopolymerization which can solve the problems of conventional cationic photopolymerization mentioned above, in other words, it is possible to produce a cured products which have sufficient hardness, good physical and electrical properties.

Therefore, an object of the present invention is an initiator for photopolymerization of cationically polymerizable material, characterized in that said initiator comprises a composite obtainable from a reaction between (a) a charge-transfer complex consisting of biscyclopentadienyl iron derivative and quinoid and (b) at least one salt selected from a group consisting of tetrafluoroborates, hexafluorophosphates and hexafluoroantimonates.

Another object of the present invention is a method for photopolymerization of cationically polymerizable organic material, characterized in that said cationically polymerizable organic material is exposed to light having the wavelength of 200–500 nm in the presence of the initiator comprising a composite obtainable from a reaction between (a) a charge-transfer complex consisting of biscyclopentadienyl iron derivative and quinoid and (b) at least one salt selected from a group consisting of tetrafluoroborates, hexafluorophosphates and hexafluoroantimonates.

BRIEF DESCRIPTION OF THE INVENTION

The first ingredient (a) of initiator for photopolymerization of the present invention is a charge-transfer complex which consists of a biscyclopentadienyl iron derivative and a quinoid.

The charge-transfer complex can be prepared by rejecting biscyclopentadienyl iron derivative with quinoid in the amount of 0.1–2 equivalents per stoichiometric amount of the former.

The usable biscyclopentadienyl iron derivative is a compound having a general formula:

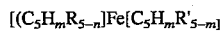

wherein R and R' are straight or branched, saturated or unsaturated alkyl group, substituted or non-substituted aryl group, carboxyl group, nitril group, nitro group, or amino group; n and m are integer ranging from 0 to 5. The example of biscyclopentadienyl iron derivative includes ferrocene, monoethyl ferrocene, monoacetyl ferrocene, 1,1'-diacetyl ferrocene, monophenyl ferrocene, 1,1'-diphenyl ferrocene, monovinyl ferrocene, monoformyl ferrocene, monocarboxy ferrocene, monocyano ferrocene, 1-acetyl-1'-cyano ferrocene, mononitro ferrocene, 1-ferrocenyl-2-nitroethylene, 1,2-diphenyl ferrocene, 1-ferrocenyl-1-piperidyl-2-nitropropane, 1,3,1',3'-tetraphenyl ferrocene, 1,2,4,1',2',4'-hexaphenyl ferrocene, 1,2,3,4,1',2',3',4'-octaphenyl ferrocene, 1,2,3,4,5,1',2',3',4',5'-decaethyl ferrocene, 1,1'-dimethyl-2-ethyl ferrocene, etc. The biscyclopentadienyl iron derivative is used in single or mixture of at least two members. Particularly, suitable biscyclopentadienyl iron derivative is ferrocene.

The "quinoid" which constitutes the charge-transfer complex means compounds having such structure that one of endocyclic double bonds in aromatic compound is decreased and two exocyclic double bonds are present at p- or o-position. The quinoid includes quinone in which the atoms of exocyclic double bonds are oxygen; quinonimine in which the atoms of exocyclic double bonds are oxygen and nitrogen; quinodiimine in which the atoms of exocyclic double bonds are nitrogen; quinomethane in which the atoms of exocyclic double bonds are carbon and oxygen; and quinodimethane in which the atoms of exocyclic double bonds are carbon. In particular, the suitable quinoid is at least one compound selected from among quinones and quinodimethanes. The example of quinoid includes p-benzoquinone, 2,5-dichloro-p-benzoquinone, 2,6-dichloro-p-benzoquinone, 2,3-dichloro-5,6-dicyano-p-benzoquinone, bromonyl, chloranyl, 1,4-naphthoquinone, 2,3-dichloro-1,4-naphtoquinone, anthraquinone, 2-methyl-anthraquinone, 2-ethyl-anthraquinone, 2-chloro-anthraquinone, anthraquinone-β-carboxylic acid, 9,10-phenanthraquinone, 7,7,8,8-tetracyanoquinodimethane, 2,5-dimethyl-7,7,8,8-tetracyanoquinodimethane, 11,11,12,12,-tetracycnonaphtho-2,6-quinodimethane, tetrafluoro-tetracyanoquinodimethane, etc.

The second ingredient (b) of initiator for photopolymerization of the present invention is at least one salt selected from a group consisting of tetrafluoroborates, hexafluorophosphonates and hexafluoroantimonates. More particularly, it is selected from a group consisting of sodium, potassium and silver salts of tetrafluoroboric acid, hexafluorophosphoric acid and hexafluoroantimonic acid.

The second ingredient (b) is mixed with the charge-transfer complex (a) in the amount of 0.1–2 equivalent, preferably 0.1–1 equivalent per stoichiometric amount of the charge-transfer complex (a). When the second ingredient (b) is used in the amount exceeding the range of 0.1–2 equivalent, the obtained initiator cannot initiate a polymerization.

On preparing the initiator for photopolymerization of the present invention, the charge-transfer complex of biscyclopentadienyl iron derivative and quinoid is firstly prepared as mentioned above. More particularly, the biscyclopentadienyl iron derivative and quinoid at mutual ratio selected from the range mentioned above are dissolved into a good affinity solvent and they are reacted with each other for 1–40 hours with heating under reflux. After undissolved materials are filtrated away, the second ingredient (b) is added to filtrate and the reaction is carried out for 5 min. to 2 hours with heating.

The initiator for photopolymerization of the present invention is present in the obtained reaction system solution, and after filtration, it can be added to cationically polymerizable organic material in the form of solution or solid mixture obtained by removing solvent from said reaction system solution.

The addition amount of the initiator for photopolymerization is within a range of 0.01–5 weight parts, preferably 0.1–3 weight parts per 100 weight parts of cationically polymerizable organic material.

The good affinity solvent suitable for the preparation or, initiator for photopolymerization is selected from a group consisting of alcohols, ethers, ketones, liquid nitril compounds, cyclic esters and carbonates. The example thereof includes methanol, tetrahydrofuran, acetone, methylethyl ketone, dioxane, acetonitril, benzonitril, propiolactone, ε-caprolactone, propylene carbonate, etc.

The cationically polymerizable organic materials to which the initiator for photopolymerization of the present invention can be applied are ethylenic unsaturated compounds, heterocylic compounds, methylol compounds, etc. An important character of the initiator for photopolymerization of the present invention is an ability to convert a monomer into high molecular weight state in a very short time, and accordingly the initiators of the present invention prove their worth in case that they are applied to epoxy resin which is a main ingredient of paints, adhesives, etc.

The "epoxy resin" means a compound which has a various molecular weight and at least two oxirane rings in its molecular chain or side chain or at its molecular end. As the compound, products obtainable from a reaction between various diol or polyol compound and epichlorohydrin in the amount equivalent to OH groups can be used. The example of epoxy resin includes bisphenol A, bisphenol F, hydrogenation products or bromination products thereof, cresol-novolak, phenolnovolak, polycondensation products between polyhydric alcohol or the like and epichlorohydrine. The epoxydated resin can be also used which are prepared by treating a cyclohexen ring-containing compound or a compound having unsaturated double bonds (such as polybutadiene, polyisoprene, etc.) with an organic peroxide (such as peracetic acid, etc.) in order to introduce oxygen of oxirane type into a molecular chain, side chain or ring structure.

These epoxy resins can be used in single, or in blend thereof or mixture with other resin or powdery additives in accordance with desired properties, method for application, etc. They can be diluted with a suitable diluent to lower its viscosity. The diluent suitable for this purpose is monoepoxy compound, the examples of which are phenylglycidyl ether, glycidyl (metha)acrylate, styrene oxide, cyclohexyl oxide, etc.

When the initiator for photopolymerization of the present invention is added to epoxy resin or other cationically polymerizable organic material, the initiator can vest the cationically polymerizable organic material with photopolymerization activity. The cationically polymerizable organic material vested with photopolymerization activity by the initiator absorbs an energy of 2000–6000 mJ/cm$^2$, in general with irradiation of near-ultraviolet light of 200–500 nm, preferably at least 300–400 nm and form an un-tacky film. The irradiation of near-ultraviolet light can be carried out under vacuum, inert gas-pressurized atmosphere or atmospheric pressure, and the photopolymerization progresses rapidly at ambient temperature or with cooling or heating. The cationically polymerizable compound vested with photopolymerization activity by the addition of the initiator of the present invention can be easily polymerized with irradiation of light. When the polymerization is not completed with only the irradiation, it can be completed by converting at first the cationically polymerizable organic material to non-fluidized state by irradiating (in case of epoxy resin, B-stage curing state) and then by maintaining the organic material of non-fluidized state at ambient temperature or heating, if necessary. In other words, when the initiator for photopolymerization of the present invention is used, the rate and degree of polymerization can be controlled in accordance with a purpose and desired physical properties by adjusting the photoenergy.

To further illustrate the present invention, and not by way of limitation, the following examples are given. In these examples, as reagents, solvents, etc., commercially available products are used as such without any purification. The used apparatus, irradiator of ultraviolet ray, etc. are articles which are easily available.

EXAMPLE 1

An eggplant type flask made of Pyrex glass (capacity of 100 ml) provided with a stirrer and a reflux condenser was charged with ferrocene (1.86 g) and p-benzoquinone (1.08 g) together with methanol (100 ml) and the resulting mixture was heated under reflux on an oil bath for 16 hours. Before the solution cools; undissolved materials were filtrated away. Sodium hexafluoroantimonate (1.29 g) was added to the filtrate and the resulting mixture was heated under reflux on an oil bath for further 1 hour. Thereafter, the solution was cooled down to ambient temperature and then to -20° C. After removing the precipitates by filtration, the filtrate was evaporated under reduced pressure to dryness. Thus a mixture of yellow and black crystals was obtained with the yield of 77.5%.

EXAMPLE 2

Using the apparatus similar to that of Example 1, ferrocene (0.93 g) was dissolved into methanol (100 ml) with heating. After confirming the fact that ferrocene was completely dissolved into methanol, 2,6-dichloro-p-benzoquinone (0.88 g) was added to the resulting solution and the obtained mixture was heated under reflux for 15 hours. Thereafter, before the solution cools, undissolved materials were removed by filtration. Sodium hexafluoroanitimonate (1.29 g) was added to the filtrate and the resulting solution was heated under reflux for 1 hour. The solution was cooled down to ambient temperature and further to −20° C. After removing the precipitated crystals by filtration, the filtrate was evaporated under reduced pressure to dryness. Deep green crystal was obtained with yield of 80.7%.

EXAMPLE 3

Using the apparatus similar to that of Example 2, the operation was carried out in accordance with the procedure similar to that of Example 2 and greenish brown crystal was obtained with yield 71.9%, starting from methanol (100 ml), ferrocene (0.9 g), chloranyl (1.23 g) and sodium hexafluoroantimonate (1,29%).

EXAMPLE 4

Using the apparatus similar to that of Example 2, in accordance with the procedure similar to that of Example 2, ferrocene (0.43 g) was dissolved into methanol (100 ml) with heating. To the resulting solution, 2,3-dichloro-5,6-dicyano-p-benzoquinone (0.113 g) was added and the solution was heated under reflux for 3 hours. After the filtration in hot was carried out, sodium hexafluoroantimonate (1.29 g) was added to the filtrate and the resulting solution was heated under reflux for 1 hour. Then the solution was subjected to the similar post-treatment and brown crystal was obtained with yield of 86.8%.

EXAMPLE 5

Using the apparatus similar to that of Example 1, 2,3-dichloro-5,6-dicyano-p-benzoquinone (2.27 g) was dissolved into acetonitril (100 ml). After ferrocene (1.86 g) was added to the resulting solution, the solution was heated under reflux for 16 hours, and it was cooled down to ambient temperature and further to −20° C. The precipitated crystal was recovered by filtration. After drying the crystal at 65° C., the crystal was dissolved again into methanol (100 ml). Sodium hexafluoroantimonate (1.29 g) was added thereto and the resulting solution was heated under reflux for 1 hour. The solution was cooled down to ambient temperature and further to −20° C. The precipitated crystal was recovered by filtration and dried. The obtained crystal has a color of deep brown.

EXAMPLE 6

Using the apparatus similar to that of Example 1, the operation was carried out in accordance with the procedure similar to that of Example 1, a mixture of yellow-black crystals was obtained with the yield of 76.7%, starting from methanol (100 ml), ferrocene (1.86 g), 1,4-naphthoquinone (1.58 g) and sodium hexafluoroantimonate (1.29 g).

EXAMPLE 7

In the apparatus of Example 1, the operation was carried out in accordance with the procedure similar to that of Example 1. Starting from tetrahydrofuran (100 ml), ferrocene (0.93 g), 7,7,8,8,-tetracyanoquinodimethane (1.02 g) and sodium hexafluoroantimonate (1.29 g), a mixture of yellow-black crystals was obtained with the yield of 84.4%.

EXAMPLE 8

In the apparatus described in Example 1, the operation was carried out in accordance with the procedure similar to that of Example 1. Starting from tetrahydrofuran (100 ml), ferrocene (1.86 g), 7,7,8,8-tetracyanoquinodimethane (1.02 g), 9,10-phenanthraquinone (1.04 g) and sodium hexafluoroantimonate (1.29 g), red-brown crystal was obtained with the yield of 90.6%.

EXAMPLE 9

Using the same apparatus as Example 1, 7,7,8,8-tetracyanoquinodimethane (1.02 g) was dissolved into acetnitril (100 ml) with heating. Ferrocene (0.93 g) was added thereto and the resulting solution was heated under reflux for 16 hours. Thereafter, the filtration in hot was carried out, sodium tetrafluoroborate (0.55 g) was added to the filtrate, which was treated similarly to preceding Examples. As a result, green crystal was obtained with the yield of 61.8%.

EXAMPLES 10–16

The initiators for photopolymerization prepared in preceding Examples 1–9 were added to cycloaliphatic epoxy resin [Ciba-Geigy, ARALDITE (registered trade mark) CY-179] in the amount of 2 weight parts per 100 weight parts of the epoxy resin and the mixture was stirred sufficiently to prepare a uniform solution. This solution was applied uniformly on a glass plate with a thickness of about 50 μm and was exposed to light. The exposure amount necessary to cure the solution to make a film and the hardness of the obtained film were reported in Table 1.

The irradiation was carried out with a high pressure mercury lamp. The light emitted by the mercury lamp was treated with a cold mirror and a visible light cutting filter to transform the light into near-ultraviolet light having the wavelength of 200–400 nm in order to prevent effects of heat ray. The exposure amount was determined as accumulated luminous energy. The hardness of film was determined by a comparison with the hardness of lead of pencil in accordance with JIS-K-5400.

TABLE 1

| Example (No.) | Initiator | Luminous energy necessary to make a film (mJ/cm$^2$) | Hardness of film | Color of film |
|---|---|---|---|---|
| 10 | Example 1 | 6,000 | F | light-green, transparent |
| 11 | Example 2 | 3,600 | F | green, transparent |
| 12 | Example 3 | 3,600 | H | brown, transparent |
| 13 | Example 4 | 5,400 | 2H | brown, transparent |
| 14 | Example 5 | 4,500 | 2H | red-brown, transparent |
| 15 | Example 7 | 2,700 | 3H | green, transparent |
| 16 | Example 8 | 4,500 | H | green-brown, transparent |

EXAMPLES 17–20

In a glass ampoule bottle (15 ml), 7,7,8,8-tetracyanoquinodimethane (0.102 g) was added to acetnitril (10 g) and the bottle was sealed. The contents were heated to 65° C. with stirring by a magnetic stirrer. After confirming the fact that 7,7,8,8-tetracyanoquinodimethane was completely dissolved, a plug was removed, a predetermined amount of ferrocene was added thereto, the bottle was sealed again, and the contents were heated further for 16 hours with stirring. Thereafter, the still hot solution was filtered, a predetermined amount of sodium hexafluoroantimonate was added to the filtrate, the bottle was sealed, and the contents were heated at 65° C. for further 1. hour with stirring. After the period lapsed, the solution was cooled down to −20° C., and the precipitated crystal was filtered away. Thus obtained filtrate contained initiator for photopolymerization in the amount of 1.9–2.3% and had a color of deep green. This initiator for photopolymerization was added to and mixed with bisphenol A type epoxy resin having the molecular weight of about 380 (epoxy equivalent=about 190) in such amount that the initiator for photopolymerization is present at the content of 2 wt %. In this way, a uniform solution was obtained. The solution was applied on a glass plate at the thickness (as dry film) of about 50 μm. The film was dried in a hot fluid-circulating furnace at 65° C. for 20 min. and was exposed to light.

The feeding amount of ingredients of initiator, luminous energy necessary to make a film, and hardness of film were reported in Table 2. The luminous energy necessary to make a film, hardness of film were determined similarly to the preceding Examples 10–16.

TABLE 2

| Ex. No. | Ingredient of Initiator (g) | | | | Luminous energy necessary to make a film (mJ/cm$^2$) | Hardness of film |
|---|---|---|---|---|---|---|
| | ferrocene | TCNQ | NaSbF$_6$ | mole ratio | | |
| 17 | 0.093 | 0.102 | 0.129 | 1:1:1 | 3,600 | 2H |
| 18 | 0.093 | 0.102 | 0.065 | 1:1:0.5 | 5,400 | H |
| 19 | 0.186 | 0.102 | 0.129 | 1:0.5:0.5 | 4,500 | H |
| 20 | 0.093 | 0.204 | 0.258 | 0.5:1:1 | 5,400 | H |

The initiator for photopolymerization of the present invention have the following merits in comparison with the conventional initiators.

1. The polymerization can be completed by an irradiation of light having the wavelength of 200–500 nm.
2. Even when the initiator is added to monomer in comparatively small amount, it can vest the monomer with photopolymerization activity because of its high photopolymerization capacity.
3. Because the sensitizing wavelength zone is within a long wavelength zone, it has a sufficient ability to initiate a photopolymerization without any sensitizer.
4. The preparation thereof is very easy.

What is claimed is:

1. A method for photopolymerization of cationically polymerizable organic material, comprising exposing said cationically polymerizable organic material to light in the presence of an initiator, wherein said initiator is a composite obtainable from a reaction between:
   (a) a charge-transfer complex; and
   (b) 0.1–2 equivalents per stoichiometric amount of said charge-transfer complex of at least one salt selected from the group consisting of sodium, potassium and silver salts of tetrafluoroborates, hexafluorophosphates and hexafluoroantimonates; wherein said charge transfer complex is obtained by reacting in the presence of a good affinity solvent;
(i) a biscyclopentadienyl iron compound wherein said biscyclopentadienyl iron compound has a general formula $$(C_5H_nR_{5-n})Fe(C_5H_mR'_{5-m})$$

wherein R and R' are straight or branched, saturated or unsaturated alkyl groups, substituted or non-substituted aryl groups, carboxyl groups, nitril groups, or amino groups, n and m are integers ranging from 0 to 5; with
(ii) 0.1–2 equivalents per stoichiometric amount of said biscyclopentadienyl compound of a quinoid.

2. The method for photopolymerization claimed in claim 1, wherein said cationically polymerizable organic material is selected from the group consisting of epoxy resin, ethylenic unsaturated compound, heterocyclic compound or methylol compound.

3. The method for photopolymerization claimed in claim 2, wherein said epoxy resin is selected from the group consisting of bisphenol A, bisphenol F, hydrogenation products or bromination products thereof, cresolnovolak, phenolnovolak, polycondensation products between polyhydric alcohol or the like and epichlorohydrine, and epoxydated resins having oxyrane oxygen in its molecular chain, side chain or cyclic structure, said epoxydated resins being prepared by treating a compound having one or more unsaturated double bonds with an organic peroxide.

4. The method for photopolymerization claimed in claim 1, wherein said photopolymerization is carried out in the presence of said initiator in the amount of 0.01–5 weight parts per 100 weight parts of said cationically polymerizable organic material.

5. The method for photopolymerization claimed in claim 1, wherein said photopolymerization is effected by an irradiation of light having the wavelength of 200–500 nm.

6. The method for photopolymerization claimed in claim 1, wherein said photopolymerization is carried out under vacuum, inert gas-pressurized atmosphere or atmospheric pressure at ambient temperature or with cooling or heating.

7. The method for photopolymerization claimed in claim 1, wherein said photopolymerization is carried out in the presence of a diluent, said diluent being selected from the group consisting of phenylglycidyl ether, glycidyl (meth-a)acrylate, styrene oxide, and cyclohexene oxide.

* * * * *